(12) United States Patent
Liu

(10) Patent No.: US 9,093,141 B2
(45) Date of Patent: Jul. 28, 2015

(54) PHASE CHANGE MEMORY DEVICES, METHOD FOR ENCODING, AND METHODS FOR STORING DATA

(71) Applicant: INTERMEC IP CORP., Everett, WA (US)

(72) Inventor: Zhiyong Liu, Singapore (SG)

(73) Assignee: Intermec IP Corp., Everett, WA (US)

( * ) Notice: Subject to any disclaimer, the term of this patent is extended or adjusted under 35 U.S.C. 154(b) by 0 days.

(21) Appl. No.: 13/717,294

(22) Filed: Dec. 17, 2012

(65) Prior Publication Data

US 2013/0155766 A1 Jun. 20, 2013

Related U.S. Application Data

(60) Provisional application No. 61/576,538, filed on Dec. 16, 2011.

(51) Int. Cl.
| | |
|---|---|
| G11C 11/00 | (2006.01) |
| G11C 13/00 | (2006.01) |
| H01L 45/00 | (2006.01) |
| G11B 9/04 | (2006.01) |

(52) U.S. Cl.
CPC .............. *G11C 13/0004* (2013.01); *G11B 9/04* (2013.01); *G11C 13/0069* (2013.01); *H01L 45/06* (2013.01); *H01L 45/1213* (2013.01); *H01L 45/1233* (2013.01); *H01L 45/1286* (2013.01); *H01L 45/144* (2013.01); *G11C 2013/008* (2013.01)

(58) Field of Classification Search
CPC ............. G11C 13/069; G11C 13/0004; G11C 13/0004; G11C 13/0069
USPC .................................................. 365/163, 148
See application file for complete search history.

(56) References Cited

U.S. PATENT DOCUMENTS

| | | | |
|---|---|---|---|
| 4,896,298 A | 1/1990 | Kowalski | |
| 7,094,364 B2 * | 8/2006 | Potyrailo et al. | ........... 252/408.1 |
| 7,453,081 B2 | 11/2008 | Happ et al. | |
| 7,855,435 B2 * | 12/2010 | Klostermann et al. | ........ 257/584 |
| 2011/0044086 A1 * | 2/2011 | Schuette | ....................... 365/113 |

OTHER PUBLICATIONS

Bozorg-Grayeli et al., "Temperature-Dependent Thermal Properties of Phase-Change Memory Electrode Materials," IEEE Electronic Device Letters 32(9), 1281-1283, Sep. 2011.
Hudgens et al., "Overview of Phase-Change Chalcogenide Nonvolatile Memory Technology," MRS Bulletin, pp. 1-4, Nov. 2004.

(Continued)

*Primary Examiner* — Huan Hoang
(74) *Attorney, Agent, or Firm* — Additon, Higgins & Pendleton, P.A.

(57) ABSTRACT

Phase change memory cells including a phase change media can be encoded using a source of energy that is not integral with the memory cell. External sources of energy include thermal heads, such as those used in direct thermal printing or thermal transfer printing and sources of electromagnetic radiation, such as lasers. Such types of phase change memory devices can be associated with substrates that include thermochromic materials or are suitable for thermal transfer printing so that the memory cells can be encoded and print media applied to the substrate using the same source of thermal energy.

17 Claims, 4 Drawing Sheets

(56) References Cited

OTHER PUBLICATIONS

Pohm et al., "Chalcogenide Glass Bistable Resistivity (Ovonic) Memories," IEEE Transactions on Magnetics, p. 592, Sep. 1970.

Qureshi et al., "Improving Read Performance of Phase Change Memories via Write Cancellation and Write Pausing," 2010 IEEE 16th International Symposium on High Performance Computer Architecture (HPCA), pp. 1-11. Jan. 9-14, 2010.

UBM TechInsights, "Patent Perspective—Phase Change Memory Patent Landscape (in Light of Micron's Intention to Purchase Numonyx)", May 28, 2010, 7 pages.

Wikipedia, "Phase-change memory," retrieved from http://en.wikipedia.org/wiki/Phase-change_memory, last modified Jul. 5, 2011, 8 pp.

* cited by examiner

PHASE CHANGE MEMORY DEVICES, METHOD FOR ENCODING, AND METHODS FOR STORING DATA

BACKGROUND

1. Technical Field

The subject matter described herein relates to phase change memory devices, devices and methods for changing the state of a phase change media, and methods of storing retrievable data in a phase change memory device.

2. Description of the Related Art

Several technologies, such as magnetic random access memory (MRAM), flash, and phase change memory (PCM) have emerged to bridge the speed gap between DRAM and disc memory solutions. PCM has read latency close to DRAM, high write endurance, and is expected to have higher density than DRAM, all of which makes PCM an interesting technology for building large-scale main memory systems.

Known PCM is a type of nonvolatile memory that exploits the property of a phase change media, such as an alloy of germanium, antimony, and tellurium commonly referred to as the chalcogenide GST, to switch between two states, an amorphous state and a polycrystalline state, by applying electrical pulses which control local heat generation inside a PCM cell. The amorphous state is characterized by high electrical resistivity, whereas the polycrystalline state exhibits low resistivity. This difference in resistivity between the amorphous state and the polycrystalline state can be 3 to 5 orders of magnitude. Different heat-time profiles can be used to switch from one state to another. The proportion of states inside a PCM cell can be used to represent a variety of logical states, the simplest scenario being that of a binary cell based on the amorphous state and the crystalline state. However, the large difference in resistivity and ability to manipulate the proportion of the two states in a PCM cell has reportedly made it possible to store multiple bits per cell (MLC). It is reported that prototypes capable of storing 2 bits/cell have been proposed and some studies have also analyzed 4 bits/cell. To achieve high density, it is desirable that PCM cells store multiple bits, especially as technology scales to smaller feature sizes.

Figure 1:
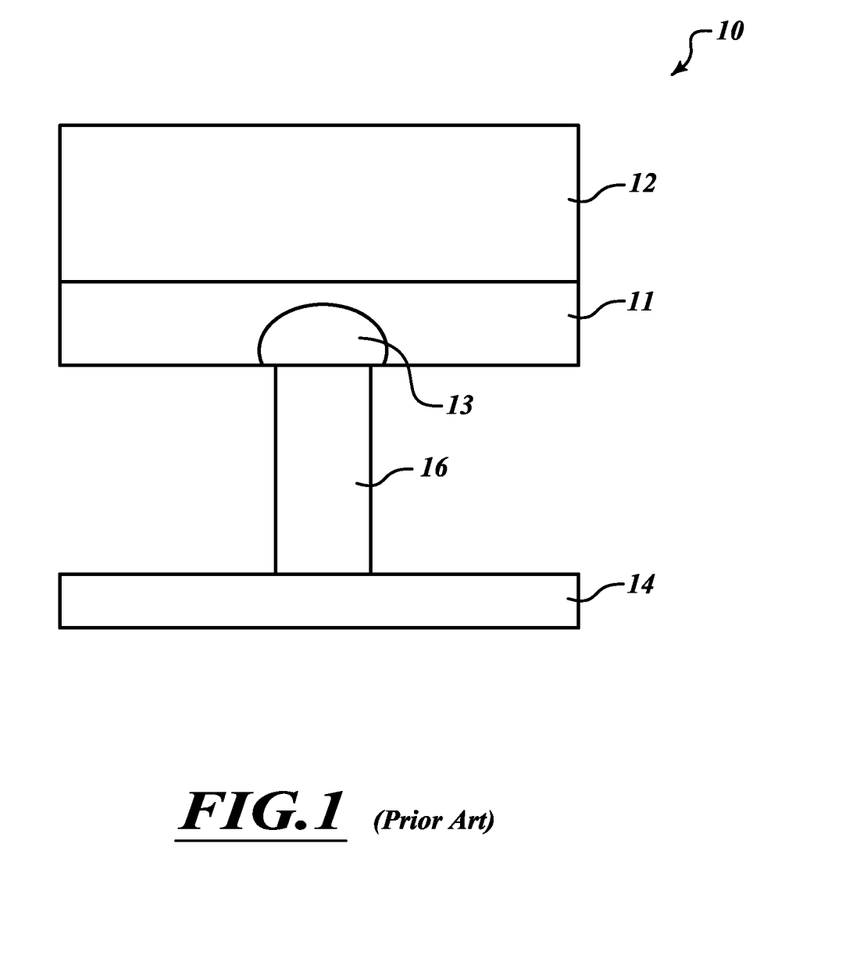
FIG. 1 is a schematic cross-section view of a phase change memory cell of the prior art.

One challenge of utilizing PCM devices is to achieve reliable programming with low programming currents. Work on PCM cell designs has focused at least in part on achieving programming currents that are consistent with existing lithography generations. Because GST alloys melt at 610° C., managing heat loss is another important aspect of achieving a low programming current. One approach to managing heat loss is provided by the PCM cell illustrated in FIG. 1. FIG. 1 shows a physical structure of a PCM cell 10 often referred to as a mushroom PCM cell. Cell 10 consists of a layer of phase change media 11, a top electrode 12 above the phase change media layer and a bottom electrode 14 below the phase change media layer. Positioned between bottom electrode 14 and phase change media layer 11 is an extended vertical electrode 16 of a resistive heater material. The resistive material 16 increases in temperature in response to an electric current. The use of this embedded vertical electrode of resistive heater material serves to reduce heat loss to the silicon substrate. In known PCM cells, resistive material, bottom electrode 14 and top electrode 12 are often responsible for generation of thermal energy within the cell in response to the flow of an electric current through resistive material 16. The thermal energy generated by the electric current is transferred to a portion of the layer of phase change media schematically represented by mushroom cap shaped portion 13 where it causes an increase in the temperature of portion 13. Logically, PCM cells are described as programmable resistors. To set the PCM cell to a crystalline state, a sustained current pulse is applied to the resistive material to generate sufficient thermal energy to increase the temperature of the phase change material to above its crystallization temperature ($T_c$), but below its melting temperature ($T_a$). When heated to above its crystallization temperature, but not above its melting temperature, the phase change media takes its crystalline state having a low resistivity relative to its resistivity in its amorphous state. To reset the PCM cell to its amorphous state, a short electrical pulse is applied to the resistive material to generate thermal energy sufficient to heat portion 13 of phase change media above its melting point. Once heated above its melting point, portion 13 of phase change media layer transforms into its amorphous state (high resistivity relative to its crystalline state) which it maintains when cooled rapidly.

A thermal printer employs thermal print technology to produce a printed image by selectively heating a coated thermochromic paper when the paper passes over a thermal print-head of the thermal printer. The thermochromic coating turns black (or another color) in areas where it has been heated by the thermal print-head, thus producing an image. Two-color direct thermal printers can print both black and an additional color (often red) by providing a thermal print-head that can be heated to two different temperatures and contacted with the thermochromic paper. Such type of thermal print technology is also employed in thermal transfer printing where one side of a heat sensitive ribbon is contacted with a thermal print-head and a portion of a coating on the opposite side of the ribbon melts and attaches to a material which is in contact with the coating. Current thermal print-head technology provides resolutions as high as 4800 DPI. Print-heads capable of providing lower resolutions, such as 203 DPI, 300 DPI, and 406 DPI are commercially available. Thermal printers have been used for many applications, including producing bar code labels, clothing labels, and printing plastic labels for chemical containers.

In addition to a thermal print-head, a thermal printer includes other components, including a platen which assists in feeding a substrate to the thermal print-head, a biasing element that applies pressure to the thermal head causing it to contact the temperature-sensitive substrate or ribbon, and a controller for controlling the operation of the thermal printer. In operation, the controller includes circuits that control the flow of electrical currents to the heating elements of the thermal head, causing selected portions of the thermal head to increase in temperature. The controller may also control the speed the substrate moves relative to the print-head of the movement of the print-head relative to the substrate.

With the continued interest in PCM devices for large-scale main memory systems as well as smaller scale memory systems, interest remains in PCM cell structures that require low current to set and reset the cell.

BRIEF SUMMARY

As an overview, this application describes phase change memory cells configured for encoding by application of energy, such as thermal energy or electromagnetic energy, to a substrate associated with the phase change memory cell, from an energy source external to the phase change memory cell. Examples of external sources of thermal energy include thermal print heads, thermal transfer print heads, and the like. Examples of sources of electromagnetic energy include lasers and the like. Such phase change memory cells are useful in methods described herein for changing the state of a phase change media in a phase change memory cell and methods of storing retrievable data in a phase change memory cell. The methods described herein change the state of a phase change media in a phase change memory cell by applying energy sufficient to increase the temperature of a substrate including the phase change memory cell and transferring thermal energy from the substrate to the phase change media. In addition, phase change memory cells of the type described herein are useful in combination with devices for changing the state of a phase change media in a phase change memory cell.

Phase change memory cells of the type described herein do not rely on a resistive material integral with the cell to produce thermal energy in response to electric pulses, nor do they increase the temperature of a phase change media using thermal energy generated within the cell. Phase change memory cells of the type described herein are configured to be encoded using energy from energy sources that are not integral with the phase change memory cell, for example thermal energy sources and sources of electromagnetic radiation that are external to the phase change memory cell.

Phase change memory cells of the type described herein can be formed in a semiconductive material substrate. The semiconductive material substrate can be combined with other substrate materials capable of being encoded with print media. Examples of such other substrate materials include thermochromic media and media compatible with thermal transfer print processes.

Phase change memory devices of the type described herein include a phase change memory cell that includes a phase change media having a crystallization temperature and a melting temperature. The memory cell further includes a first electrically conductive member beneath the phase change media and a second electrically conductive member above the phase change media. The memory cell is incorporated into or on a substrate and is free of a resistive material integral with the cell configured to emit thermal energy in response to flow of electric current through the resistive material.

Phase change memory cells of the type described herein can be encoded by heating a substrate including the phase change memory cell by transferring energy to the substrate from an energy source external to the cell. The energy transferred to the substrate includes thermal energy and electromagnetic radiation. Examples of mechanisms for transferring the thermal energy to the phase change media include conduction and irradiation.

Devices for changing the state of a phase change media in a phase change memory cell associated with a substrate includes an energy source configured to increase the temperature of the substrate to a degree sufficient to increase the temperature of the phase change media above its crystallization temperature or its melting temperature. The devices may also include a transport assembly configured to impart relative movement between the energy source and the substrate. The devices may include a control circuit configured to control the transfer of energy from the energy source to the substrate by controlling an amount of energy generated by the energy source and position of the energy source relative to the substrate.

Devices of the type described above can be utilized in methods for changing the state of a phase change media in a phase change memory cell associated with a substrate. Such methods involve positioning the substrate relative to an energy source and causing the energy source to increase the temperature of the substrate. According to the methods, thermal energy resulting from increasing the temperature of the substrate is transferred to the phase change media, resulting in an increase of the temperature of the phase change media without input of thermal energy from a source other than the energy source, e.g., a source of thermal energy integral with the memory cell. Such methods change the phase change media from an amorphous state to a crystalline state or from a crystalline state to an amorphous state.

Methods for storing retrievable data are described herein and include moving a substrate including a plurality of phase change memory cells past an energy source, wherein at least some of the memory cells include a phase change media having a crystalline state and an amorphous state, a first electrically conductive member beneath the phase change media, and a second electrically conductive member above the phase change media. The energy source is configured to increase the temperature of the substrate by transferring energy from the energy source to the substrate. Thermal energy resulting from the increase in temperature of the substrate is transferred to the phase change media resulting in the phase change media changing from an amorphous state to a crystalline state or a crystalline state to an amorphous state.

In embodiments where the energy source is a source of thermal energy, phase change memory devices of the type described herein can be included in a substrate that further includes media suitable for being encoded with print media such as a thermochromic media or media suitable for use in thermal print transfer processes. By including phase change memory devices of the type described herein in a substrate that includes media suitable for being encoded with print media, a thermal print-head can be utilized to encode additional information, such as print media onto the substrate.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and they have been solely selected for ease of recognition in the drawings.

DETAILED DESCRIPTION

It will be appreciated that, although specific embodiments of phase change memory devices, devices for changing the state of a phase change media in a phase change memory cell, methods of changing the state of a phase change media in a phase change memory cell, and methods of storing retrievable data are described herein for purposes of illustration, various modifications may be made without departing from the spirit and scope of such descriptions. Accordingly, the subject matter described herein is not limited except as by the appended claims.

In the following description, certain specific details are set forth in order to provide a thorough understanding of various aspects of the disclosed subject matter. However, the disclosed subject matter may be practiced without these specific details. In some instances, well-known components associated with phase change memory cells, methods of forming phase change memory cells and incorporating them into, on or in association with a substrate, and thermal printing devices and techniques, comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Specific embodiments are described herein with reference to a phase change media based on a GST chalcogenide; however, the present disclosure and the reference to a phase change media should not be limited to chalcogenides or GST. Specific embodiments are described herein with reference to substrates that are semiconductive materials; however, the present disclosure and the reference to a substrate should not be limited to substrates formed from semiconductive materials. Specific embodiments are described herein with reference to a energy sources based on thermal print heads and lasers; however, the present disclosure and the reference to an energy source should not be limited to thermal print heads or lasers.

In the figures, identical reference numbers identify similar features or elements. The sizes and relative positions of the features in the figures are not necessarily drawn to scale.

Figure 2:
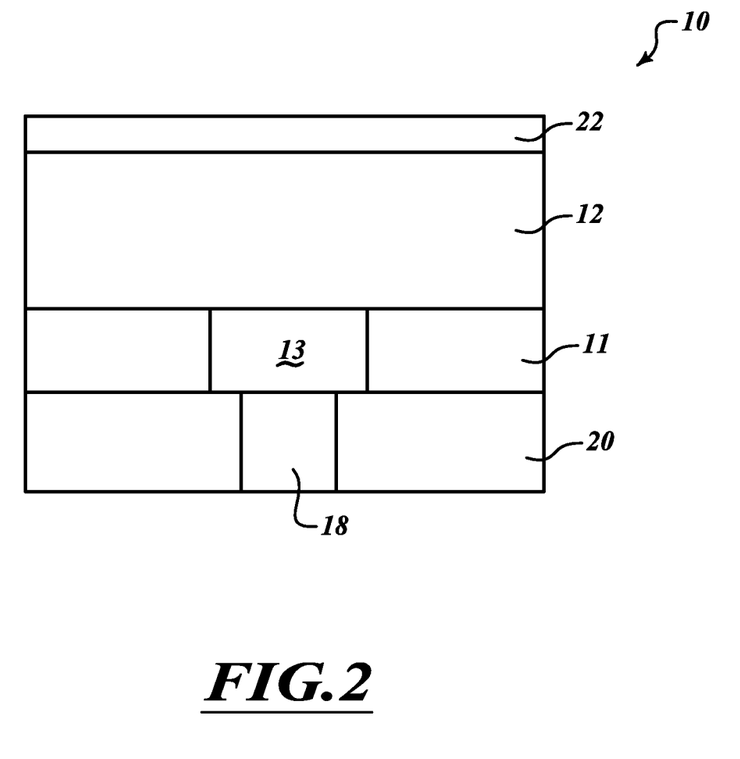
FIG. 2 is a schematic cross-section section of a phase change memory cell in accordance with subject matter described herein.

Referring to FIG. 2, a phase change memory (PCM) device 10 of the type described herein, includes elements similar to the PCM cell described above with reference to FIG. 1. Specifically, the phase change memory device 10 of FIG. 2 includes a bottom electrode 18 formed in a substrate 20, such as a semiconductive material. Above bottom electrode 18 and substrate 20 is a programmable layer 11 that includes a programmable volume 13. Above programmable layer 11 is top electrode 12 and protective layer 22. Phase change memory devices of the type described with reference to FIG. 2 can be produced using known CMOS processing techniques and materials.

Substrate 20 is formed from known materials suitable for substrates in a semiconductor device. Examples of such suitable materials include silicon and silicon dioxide. Bottom electrode 18 is formed in substrate 20 using known techniques such as photolithography and electroplating and known materials such as aluminum, copper, or other metals used as conductive lines in semiconductor devices. Located above bottom electrode 18 is a layer 11 of phase change media. Phase change media layer 11 includes a programmable volume 13 in electrical communication with bottom electrode 18. Phase change media layer 11 is formed using known techniques such as sputtering, chemical vapor deposition, and plasma enhanced chemical vapor deposition.

Unlike known phase change memory cells that include a feature integral with the memory cell configured to convert electrical current into thermal energy (i.e., heaters) used to increase the temperature of the programmable volume 13, embodiments of a phase change memory device of the type described herein do not require a resistive material integral with the memory cell and configured to generate thermal energy in response to a flow of electric current. In contrast, phase change memory devices of the type described herein utilize an external source of non-electrical energy, such as thermal energy or electromagnetic radiation, to provide the energy used to change the temperature of the programmable volume 13 of the phase change media. Accordingly, bottom electrode 18 can be formed from materials that have an electrical resistance less than the electrical resistance of materials used to form the "heaters" in known phase change memory devices. Materials such as nickel monosilicide ($1.5 \times 10^{-7}$ ohm-meters), platinum monosilicide ($2.5 \times 10^{-7}$ to $3.5 \times 10^{-7}$ ohm-meters), titanium nitride ($3 \times 10^{-7}$ to $7 \times 10^{-7}$ ohm-meters), tungsten silicide ($6 \times 10^{-7}$ to $8 \times 10^{-7}$ ohm-meters) and tungsten nitride ($3 \times 10^{-7}$ to $7 \times 10^{-7}$ ohm-meters) have a resistivity (indicated in the parentheses) making them suitable for use as heaters for increasing the temperature of a phase change media in known phase change media cells. These materials exhibit an electrical resistivity as low as about $1.5 \times 10^{-7}$ ohm-meters. In contrast, bottom electrode 18 can be formed from materials that provide electric conductive properties needed interconnect lines in a memory cell and exhibit resistivity that is less than resistivity of materials used as heaters in known phase change memory cells. For example materials having electrical resistivity less than about $1.5 \times 10^{-7}$ ohm-meters are suitable for bottom electrode 18. Non-limiting examples of such materials include metals (with their electrical resistivity in parentheses) such as nickel ($6.86 \times 10^{-8}$ ohm-meters), copper ($1.68 \times 10^{-8}$ ohm-meters), aluminum ($2.6 \times 10^{-8}$ ohm-meters), platinum ($10.6 \times 10^{-8}$ ohm-meters), gold ($2.24 \times 10^{-8}$ ohm-meters), and silver ($1.59 \times 10^{-8}$ ohm-meters). It should be understood that the materials for use as bottom electrode 18 are not limited to these metals.

While phase change memory devices of the type described herein include memory cells capable of being encoded without using a resistive material integral with the memory cell that serves as a resistance heater for increasing the temperature of the programmable volume 13, it should be understood that devices for changing the state of a phase change media in a phase change memory cell, methods of changing the state of a phase change media in phase change memory cell, and methods of storing retrievable data of the type described herein are not limited to using phase change media devices that are free of a resistive material configured to emit thermal energy in response to a flow of electric current. In other words, the devices for changing the state of a phase change media in a phase change memory cell, methods of changing the state of a phase change media in a phase change memory cell, and methods of storing retrievable data of the type described herein can also be practiced using known phase change media devices that include and use a resistive heater integral with the memory cell to change the temperature of the phase change media of the memory cell.

Programmable layer 11 is formed from materials capable of exhibiting a crystalline state and an amorphous state wherein its electrical resistance in the crystalline state is different than its electrical resistance in the amorphous state. The difference between the electrical resistance in the crystalline state and the electrical resistance in the amorphous state should be sufficient to represent a binary 0 and 1. Examples of materials suitable for programmable layer 11 are chalcogenide compounds consisting of at least one chalcogen ion and at least one electropositive element. Chalcogen ions include elements defined by the periodic table as chalcogens. Examples of suitable chalcogens include sulfides, selenides, and tellurides. A specific example of a chalcogenide suitable for use in the phase change memory devices described herein is an alloy of germanium, antimony, and tellurium (GeSbTe), commonly referred to as GST. GST has an elemental ratio of 2:2:5. When GST is heated to a temperature over about 600° C., its chalcogenide crystallinity is lost and once cooled it is frozen into an amorphous glass-like state exhibiting an electrical resistance that is higher than the electrical resistance of GST in its crystalline state. By heating the chalcogenide to a temperature above the temperature at which its crystallizes, but below its melting point, the GST is transformed into its crystalline state with a much lower resistance than its electrical resistance in an amorphous state. The time needed to complete this phase transition is temperature-dependent and is on the order of nanoseconds. Chalcogenide compounds exist that are able to achieve two additional distinct states in addition to a crystalline state and an amorphous state. Such chalcogenides provide an opportunity to double the storage capacity of a phase change memory device.

Top electrode 12 can be formed of materials used in known phase change memory cells as electrode materials, including aluminum, copper, or other electrically conductive metals used in semiconductor devices. Known techniques such as photolithography and electroplating are used to provide top electrode 12.

Continuing to refer to FIG. 2, protective layer 22 above top electrode 12 isolates top electrode 12 from the environment. In additional to isolating top electrode 12 from the environment, protective layer 22 also serves as the initial portion of the thermal pathway to programmable volume 13 of phase change media layer 11 as described below in more detail. In other embodiments where electromagnetic energy is used to produce thermal energy that serves to increase the temperature of programmable volume 13, protective layer 22 includes materials that when irradiated with electromagnetic energy, produce thermal energy. Example of materials for use as protective layer 22 include non- or low-electrically conductive materials or low-k dielectric materials such as nanoporous silica, hydrogensilsesquioxanes, silicon oxyfluoride, silicon carbide, carbon-doped silicon dioxide, and silicon dioxide. Dielectric materials with higher coefficients of thermal conductivity are preferred over dielectric materials with lower coefficients of thermal conductivity, particularly in memory cells of the type described herein, wherein the state of the phase change media will be changed by applying thermal energy from an external source to the cell. Preferably, protective layer 22 is formed from a thermally isotropic (transfers thermal energy in a single direction) material or is formed by a process that causes layer 22 to be thermally isotropic. The thermal energy transfer properties of protective layer 22 are selected so that it rapidly and efficiently transfers thermal energy applied to its upper surface to top electrode 12. Because thermal energy applied to the upper surface of protective layer 22 is intended to encode programmable volume 13 by changing its temperature and state, a thermally isotropic material would increase the precision of the encoding by reducing the dispersion of the applied thermal energy which would reduce the degree of unintended encoding of adjacent memory cells. In embodiments utilizing an electromagnetic energy source, dielectric materials that produce more thermal energy in response to irradiation are preferred over dielectric materials that produce less thermal energy in response to the same radiation.

Though not illustrated in FIG. 2, phase change memory cells of the type described herein can be included in phase change memory devices that include an array of memory cells of the type described herein and structures found in known phase change memory devices. For example, devices that include phase change memory cells of the type described herein may include circuits configured to perform functions of identifying each row and column in a memory cell array, keeping track of the refresh sequence, reading and restoring the signal from a cell, and instructing a cell whether it should be encoded.

Figure 4:
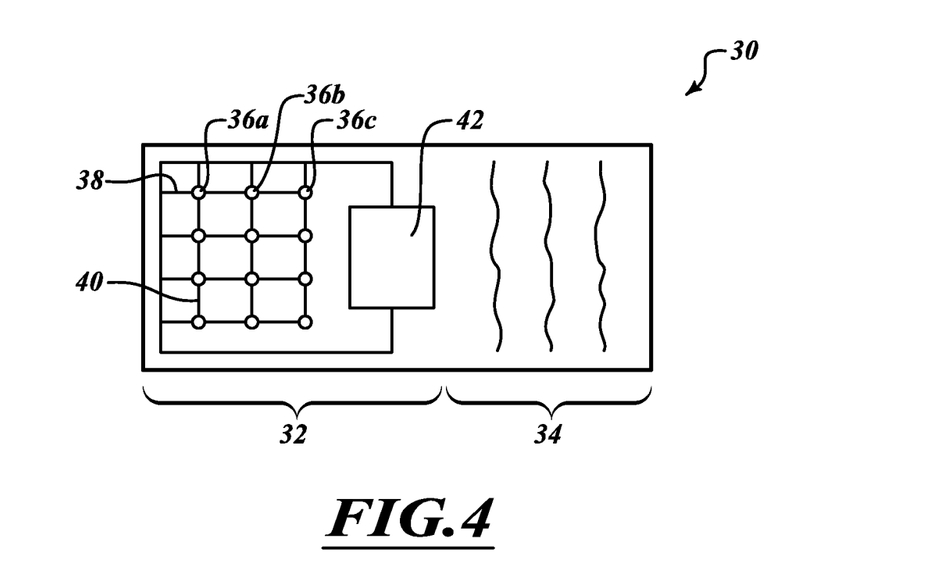
FIG. 4 is a schematic plan view of a substrate including a phase change memory device and a portion for encoding with print media.
Figure 5:
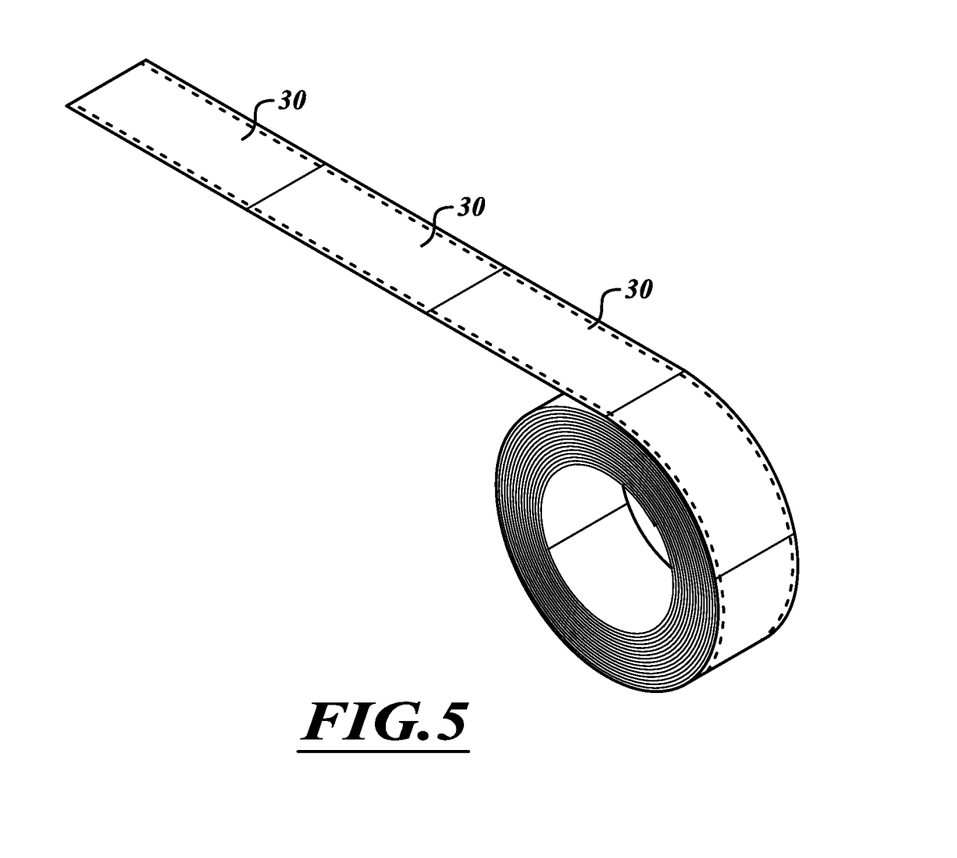
FIG. 5 is a schematic view of a substrate that includes phase change memory cells of the type described herein.

Phase change memory devices of the type described herein can be incorporated or combined with a substrate that can be encoded with print media. For example, referring to FIG. 4, an array of memory cells 36a, 36b and 36c of the type described herein forms a memory section 32 that is included as part of substrate 30 capable of being encoded with print media. Memory section 32 arranges the memory cells into bit lines 38 and word lines 40 and includes known circuitry connected to microprocessor 42 configured to read from the individual memory cells and communicate the read information to other external devices through known direct contact or contactless techniques. Substrate 30 also includes a portion 34 for receiving print media from a printing device (not shown) such as a thermal print head or thermal transfer print head. An example of one type of media 30 is ticket stock used to produce admission tickets to events. As illustrated in FIG. 5, substrate 30 can be provided in the form of a roll to facilitate feeding of the media to the printing device.

In another aspect, the subject matter described herein relates to methods of changing the state of a phase change media in a phase change memory device associated with a substrate. As described in the previous paragraph, an example of a suitable substrate is one that is suitable for cooperating with a thermal print-head to deliver thermal energy from the thermal print-head to the substrate. The description of methods for changing the state of a phase change media in a phase change memory device that follows refers to a substrate in the form of a continuous media, such as a paper or cardboard stock of the type used for printing event tickets. It should be understood that methods for changing the state of a phase change media in a phase change memory device of the type described herein are not limited to use with paper or cardboard stock that includes phase change memory cells of the type described herein. In addition methods for changing the state of a phase change media in a phase change memory device can be practiced with phase change memory cells that include an integral heater structure incorporated into the substrate.

Figure 3:
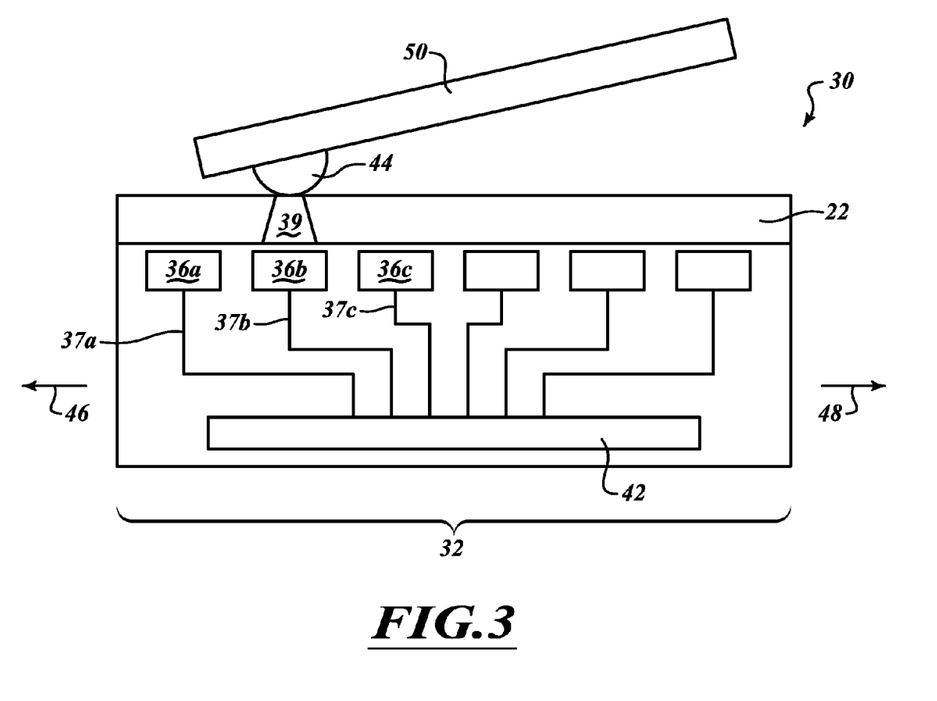
FIG. 3 is a schematic cross-section of a device for changing the state of a phase change media in a phase change memory device including a plurality of phase change memory cells and a thermal head in accordance with the subject matter described herein.

Referring to FIG. 3, a schematic cross section of memory section 32 of substrate 30 shows a plurality of phase change memory cells 36a-36c in electrical communication with microprocessor 42 via interconnect lines 37a, 37b and 37c. As described above, phase change memory cells 36a-36c and an upper electrode (not shown in FIG. 3) are isolated from the external environment by protective layer 22. An upper, exposed surface of protective layer 22 contacts a thermal head 44 configured to input sufficient thermal energy (schematically illustrated as conical feature 39 between thermal head 44 and memory cell 36b) to memory section 32 such that the temperature of the phase change media of memory cell 36b is increased to above its crystallization temperature or its melting temperature. When the thermal energy input by the thermal print head is sufficient to increase the temperature of the phase change media to above its crystallization temperature, the phase change media takes its crystalline state. When the thermal energy input by the thermal print head is sufficient to increase the temperature of the phase change media above its melting temperature, the phase change media takes it amorphous state which is maintained when the phase change media is rapidly cooled to below its crystallization temperature. Thus, by using an external source of energy, e.g., thermal energy, the state of the phase change media of a phase change memory cell is changed without using an internal resistive heater.

Methods of changing the state of a phase change media in a phase change memory cell of the type described herein are not limited to use of an external energy source that supplies thermal energy. The methods can be practiced with other sources of energy capable of increasing the temperature of the phase change media by external application of energy to the memory cell, such as sources of electromagnetic energy. An example of a source of electromagnetic energy is a laser capable of increasing the temperature of a portion of the phase change memory device adjacent the phase change memory cell to be encoded. For example, in FIG. 3, rather than contacting protective layer 22 with thermal print head 44, a laser (not shown) can be applied in the region of conical portion 39 to increase the temperature of conical portion 39 and encode cell 36b.

Thermal print head 44 is shown schematically connected to an end of a transport assembly 50 configured to move print head 44 relative to the memory cells in memory section 32. In this manner, thermal print head can move relative to substrate 30 and encode individual memory cells. Alternatively, transport assembly may hold print head 44 stationary and substrate 30 cooperates with a transport mechanism to move substrate 30 relative to print head 44. For example, continuing to refer to FIG. 3, moving substrate 30 in the direction of arrow 46 places memory cell 36c beneath head 44 where it can be encoded. Similarly, moving substrate 30 in the direction of arrow 48 places phase change memory cell 36a in a position below head 44 where it can be encoded. When media 30 is provided in the form of a continuous roll as shown in FIG. 5 it may registered with slots or other components that allow the media to cooperate with a transport assembly to advance the media by predetermined fixed amounts corresponding to the distance between adjacent memory cells in the direction of movement.

Suitable thermal heads include those of the type used in known direct thermal printers to produce high, medium or low resolution images by selectively heating coated thermochromic media as the media passes over the thermal printhead. Such thermal print-heads are commonly combined with a platen, a spring that applies pressure to the thermal head causing it to contact the media, and controller boards for controlling a transport assembly carrying the print head. Suitable thermal print-heads include those that have resolutions ranging from 200 DPI to much higher resolutions, for example 4800 DPI or more. In addition, a thermal head is capable of delivering thermal energy to the phase change memory device sufficient to increase the temperature of the phase change media in the phase change memory cells associated with the device to above the crystallization temperature and above the melting temperature of the phase change media. For a GST phase change media, the crystallization temperature ranges from about 100° C. to about 150° C. and the melting temperature is about 600° C. It should be understood that changing the temperature of the phase change media is a function not only of the amount of thermal energy delivered by the thermal head to the phase change memory device, but also the length of time that the thermal head is supplying such thermal energy. For memory applications where speed of the encoding is an important design factor, thermal heads capable of providing larger amounts of thermal energy would be preferred because they will reduce encoding times.

Another suitable thermal head is of the type used with known thermal transfer printers in which the thermal head contacts one side of a ribbon carrying a pigmented coating on the opposite side. The thermal head melts portions of the coating and the melted portions adhere to portions of a substrate that come in contact with the melted coating.

In addition to thermal heads and lasers, other devices and methods for increasing the temperature of the phase change media in accordance with subject matter described herein can be employed, including sources of thermal energy that are not integral with the memory cell or phase change media and can increase the temperature of the phase change media by external application of thermal energy to a device including phase change memory cells of the type described herein. Such types of devices and methods may apply thermal energy to the device by means of conduction or convention or by irradiation.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. Provisional Patent Application No. 61/576,538 filed Dec. 16, 2011, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A phase-change memory device comprising:
   a memory cell including a phase change media having a crystallization temperature and a melting temperature; a first electrically conductive member beneath the phase change media, and a second electrically conductive member above the phase change media; and
   a substrate associated with the memory cell, wherein the memory cell is free of a resistive material configured to (i) emit thermal energy in response to flow of electric current through the resistive material and (ii) increase the temperature of the phase change media by transferring at least a portion of the emitted thermal energy to the phase change media;
   wherein the substrate comprises a thermochromic media.

2. The memory device of claim 1, wherein the phase change media comprises a chalcogenide.

3. The memory device of claim 1, wherein the phase change media is a chalcogenide alloy including elements selected from tellurium, germanium, antimony, and sulfur.

4. The memory device of claim 1, further comprising a plurality of additional memory cells.

5. The memory device of claim 4, wherein the substrate is a semiconductive material.

6. The memory device of claim 4, wherein the substrate further comprises a thermal transfer print media.

7. The memory device of claim 5, wherein the substrate further comprises a thermal transfer print media.

8. A device for changing a phase change media's state in a phase-change memory cell associated with a substrate, the device comprising:
- an energy source selectively operable to increase the temperature of the substrate to a degree sufficient to increase the temperature of the phase change media to above the phase change media's crystallization temperature or the phase change media's melting temperature;
- a transport assembly selectively operable to impart relative movement between the energy source and the substrate; and
- a control circuit communicatively coupled to control an amount of energy generated by the energy source and a position of the energy source relative to the substrate to control the transfer of energy from the energy source to the substrate;
- wherein the transport assembly is configured to move the substrate relative to the energy source.

9. The device of claim 8, wherein the energy source is a source of thermal energy.

10. The device of claim 9, wherein the source of thermal energy is a thermal print head or a thermal transfer print head.

11. The device of claim 8, wherein the energy source is a source of electromagnetic radiation.

12. A method of changing the state of a phase change media in a phase-change memory cell associated with a substrate, the method comprising:
- positioning the substrate adjacent to an energy source;
- causing the energy source to increase the temperature of the substrate;
- transferring thermal energy resulting from the increase in temperature of the substrate to the phase change media;
- increasing the temperature of the phase change media without an input of thermal energy from a source other than the energy source;
- changing the phase change media from an amorphous state to a crystalline state or from a crystalline state to an amorphous state; and
- applying a print media to the substrate.

13. The method of claim 12, wherein causing the energy source to increase the temperature of the substrate further comprises contacting the substrate with a source of thermal energy.

14. The method of claim 12, wherein causing the energy source to increase the temperature of the substrate further comprises irradiating at least a portion of the substrate with electromagnetic energy.

15. A method of storing retrievable data comprising:
- positioning a substrate associated with a plurality of memory cells adjacent an energy source by moving the substrate and energy source relative to each other, wherein each memory cell includes a phase change media having a crystalline state and an amorphous state, a first electrically conductive member beneath the phase change media, and a second electrically conductive member above the phase change media;
- causing the energy source to increase the temperature of the substrate by transferring energy from the energy source to the substrate;
- transferring thermal energy resulting from the increase in the temperature of the substrate to the phase change media;
- changing the phase change media from an amorphous state to a crystalline state or from a crystalline state to an amorphous state; and
- applying print media to the substrate.

16. The method of claim 15, wherein causing the energy source to increase the temperature of the substrate further comprises contacting the substrate with a source of thermal energy.

17. The method of claim 15, wherein causing the energy source to increase the temperature of the substrate further comprises irradiating the substrate with electromagnetic energy.

* * * * *